(12) United States Patent
Erlbacher

(10) Patent No.: US 10,804,421 B2
(45) Date of Patent: Oct. 13, 2020

(54) UV-RADIATION SENSOR BASED ON DIAMOND

(71) Applicant: FRAUNHOFER-GESELLSCHAFT ZUR FOERDERUNG DER ANGEWANDTEN FORSCHUNG E.V., Munich (DE)

(72) Inventor: Tobias Erlbacher, Erlangen (DE)

(73) Assignee: FRAUNHOFER-GESELLSCHAFT ZUR FOERDERUNG DER ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 16/427,410

(22) Filed: May 31, 2019

(65) Prior Publication Data

US 2019/0386166 A1 Dec. 19, 2019

(30) Foreign Application Priority Data

Jun. 14, 2018 (DE) .................. 10 2018 209 549

(51) Int. Cl.
| | |
|---|---|
| H01L 31/0352 | (2006.01) |
| H01L 31/103 | (2006.01) |
| H01L 31/02 | (2006.01) |
| H01L 31/0216 | (2014.01) |
| H01L 31/028 | (2006.01) |

(52) U.S. Cl.
CPC ...... *H01L 31/103* (2013.01); *H01L 31/02005* (2013.01); *H01L 31/028* (2013.01); *H01L 31/02161* (2013.01)

(58) Field of Classification Search
CPC ......... H01L 31/0352; H01L 31/035272; H01L 31/0248; H01L 31/0256
See application file for complete search history.

(56) References Cited

U.S. PATENT DOCUMENTS

| | | | |
|---|---|---|---|
| 5,536,953 A | 7/1996 | Dreifus et al. ................. | 257/77 |
| 7,884,372 B2 | 2/2011 | Koide et al. .................... | 257/77 |
| 8,435,597 B2 | 5/2013 | Koide et al. .................. | 427/162 |

(Continued)

FOREIGN PATENT DOCUMENTS

| | | |
|---|---|---|
| EP | 2 056 365 A1 | 5/2009 |
| JP | 2004 095958 A | 3/2004 |

(Continued)

OTHER PUBLICATIONS

European Search Report dated Jun. 5, 2019 in related application No. EP 19 16 8668.

(Continued)

*Primary Examiner* — Jae Lee
(74) *Attorney, Agent, or Firm* — Renner Kenner Greive Bobak Taylor & Weber

(57) ABSTRACT

The present invention relates to a UV-radiation sensor with a radiation-sensitive region of diamond, which is formed on the first face of a semiconductor substrate and with which electrical contact can be made via at least two contact electrodes. In the proposed UV-radiation sensor, the radiation-sensitive region has two differently doped regions of diamond that form a pn-junction for purposes of radiation detection. Such a UV-radiation sensor has a high sensitivity in the wavelength range ≤200 nm.

10 Claims, 1 Drawing Sheet

(56) References Cited

U.S. PATENT DOCUMENTS

| | | | |
|---|---|---|---|
| 2003/0131787 A1* | 7/2003 | Linares | ............... C30B 25/02 117/93 |
| 2003/0155654 A1* | 8/2003 | Takeuchi | .......... H01L 29/66136 257/760 |
| 2006/0118896 A1 | 6/2006 | Kang et al. | ................. 257/431 |

FOREIGN PATENT DOCUMENTS

| JP | 2005 311238 A | 11/2005 |
|---|---|---|
| JP | 3 986432 B2 | 10/2007 |

OTHER PUBLICATIONS

Dutta et al.; *Demonstration of Diamond-Based Schottky p-i-n Diode With Blocking Voltage > 500 V;* IEEE Electron Device Letters, vol. 37, No. 9; Sep. 2016; pp. 1170-1173.

Okano et al.; *Fabrication of a Diamond p-n Junction Diode Using the Chemical Vapour Deposition Technique;* Solid State Electronics; Elsevier Science Publishers, Barking, GB; vol. 34, No, 2; Feb. 1, 1991; pp. 139-141.

\* cited by examiner

UV-RADIATION SENSOR BASED ON DIAMOND

TECHNICAL FIELD OF APPLICATION

The present invention relates to a UV-radiation sensor, which has a radiation-sensitive region of diamond on a semiconductor substrate.

UV-radiation sensors are used in many technical fields. Examples of these are the process monitoring of all processes that use UV-radiation, or optical communication, technology. In addition to a high sensitivity and a low signal-to-noise ratio, the UV sensors should also have a high UV-selectivity, i.e. they should not detect radiation in the visible or infrared spectral range, but only in the UV range. A material with a suitably large band gap is therefore suitable as a material for the radiation-sensitive region of UV-radiation sensors, as is the case with diamond.

PRIOR ART

There are already different configurations of UV-radiation sensors of known art that use diamond for the radiation-sensitive region. These can take the form of both nanocrystalline and also epitaxial diamond layers on suitable semiconductor substrates. The electrical contacts are made via Schottky contacts and/or ohmic contacts on the diamond layer.

Thus, for example, U.S. Pat. No. 7,884,372 B2 describes a UV-radiation sensor in which a doped diamond layer is applied onto a diamond substrate. Two electrodes are arranged on this diamond layer, the outer one of which surrounds the radiation-sensitive region and forms an ohmic contact from a material containing carbide/C. Within the radiation-sensitive region, a rectifying, transparent electrode of a nitride is arranged as a second contact electrode on the diamond layer.

U.S. Pat. No. 8,435,597 B2 also describes a UV-radiation sensor based on diamond. This radiation sensor has a monocrystalline diamond film on a substrate, whose surface has undergone a special treatment with ozone or oxygen atoms, which allows the sensitivity of the radiation sensor to be set at wavelengths above 220 nm.

The object of the present invention is to specify a UV-radiation sensor, which has the highest possible sensitivity in the range of wavelengths ≤220 nm (UV-C, vacuum UV) compared to the wavelength range >220 nm, and thus enables detection of UV-radiation free of interference.

Presentation of the Invention

The object is achieved with the UV-radiation sensor in accordance with patent claim 1. Advantageous embodiments of the radiation sensor are the subject matter of the dependent patent claims, or can be found in the following description together with the examples of embodiment.

The proposed UV-radiation sensor has a radiation-sensitive region made of diamond, which is formed on the first face of a semiconductor substrate, and with which electrical contact can be made via at least two contact electrodes. The radiation sensor is characterised in that the radiation-sensitive region has two differently doped regions of monocrystalline diamond, which form a pn-junction for purposes of radiation detection.

In contrast to the UV-radiation sensors of known art based on diamond, the proposed UV-radiation sensor thus has a pn-junction in the radiation-sensitive region of monocrystalline diamond, which is used for radiation detection. This configuration avoids or at least reduces electrical leakage currents during detection, such as occur with radiation sensors with Schottky contacts, and thus achieves a higher sensitivity. In particular, with the proposed radiation sensor it is possible to achieve a ratio of spectral sensitivity, between a wavelength of 200 nm and a wavelength of 240 nm, of the order of 1:1000.

The radiation sensor can be constructed in different manners for this purpose. In the preferred configurations, a vertical structure is implemented in which electrical contact is made by suitable metallisation on a front face (first side) and rear face (second side) of the semiconductor substrate with the radiation-sensitive region arranged on it. In principle, a lateral construction is also possible, in which the contacts are then only attached to the front face.

In a first advantageous configuration, the radiation-sensitive region is formed by a layer sequence of a first epitaxially grown diamond layer of a first dopant type and a second epitaxially grown diamond layer of a second dopant type on the semiconductor substrate. This layer sequence of the two diamond layers of different dopant types thus forms the pn-junction of the radiation-sensitive region.

In a second advantageous configuration, the radiation-sensitive region is formed by a first epitaxially grown diamond layer of a first dopant type on the semiconductor substrate and a locally doped region of a second dopant type in the said first diamond layer. Here, too, the pn-junction of the radiation-sensitive region is formed by the adjacent regions with the two different dopant types. The locally doped region of the second dopant type can be a region implanted into the first diamond layer. Alternatively, the locally doped region of the second dopant type can also be produced by the application of a metal catalytic etching process and epitaxial overgrowth of the etched region with the appropriate level of doping. By means of the metal catalytic etching process, a well with <111> oriented side surfaces is etched out of the first diamond layer, which is then replenished by epitaxial overgrowth.

In both configurations, the level of doping of the first epitaxial diamond layer is preferably $<1*10^{16}$ cm$^{-3}$, the level of doping of the second epitaxial diamond layer or the locally doped region in the first epitaxial diamond layer is preferably $>1*10^{18}$ cm$^{-3}$. The thickness of the second epitaxial diamond layer or the locally doped region of the second dopant type is preferably ≤300 nm. With such values a high sensitivity and a high selectivity of the UV-radiation sensor for wavelengths ≤220 nm can be obtained.

The semiconductor substrate in the proposed UV-radiation sensor, in particular in the advantageous configurations already described, preferably also consists of diamond. In principle, the semiconductor substrate can also consist of another semiconductor material such as silicon. The semiconductor substrate preferably has a high level of doping of the first dopant type and supports a full-surface metallisation on the rear face, i.e. on a second side of the semiconductor substrate located opposite the first side. This metallisation then serves as one of the contact electrodes for the radiation-sensitive region. Here the level of doping of the semiconductor substrate is selected to be sufficiently high that electrical contact can be made with the radiation-sensitive region via this metallisation. At least one local metallisation is then also applied to the second epitaxial diamond layer, or the locally doped region in the first epitaxial diamond layer, by means of which metallisation the second contact electrode for the radiation-sensitive region is formed.

The first dopant type used for the proposed UV-radiation sensor is preferably a p-doping, preferably with the dopant boron, and the second dopant type is an n-doping, preferably with the dopant phosphorus. For example, a commercially available HPHT diamond substrate can be used as the highly doped semiconductor substrate, as is commercially available with a dopant concentration of $2*10^{20}$ cm$^{-3}$.

BRIEF DESCRIPTION OF THE FIGURES

The proposed UV-radiation sensor is explained in more detail in what follows, with the aid of two examples of embodiment. Here.

EMBODIMENTS OF THE INVENTION

Figures 1A, 1B:
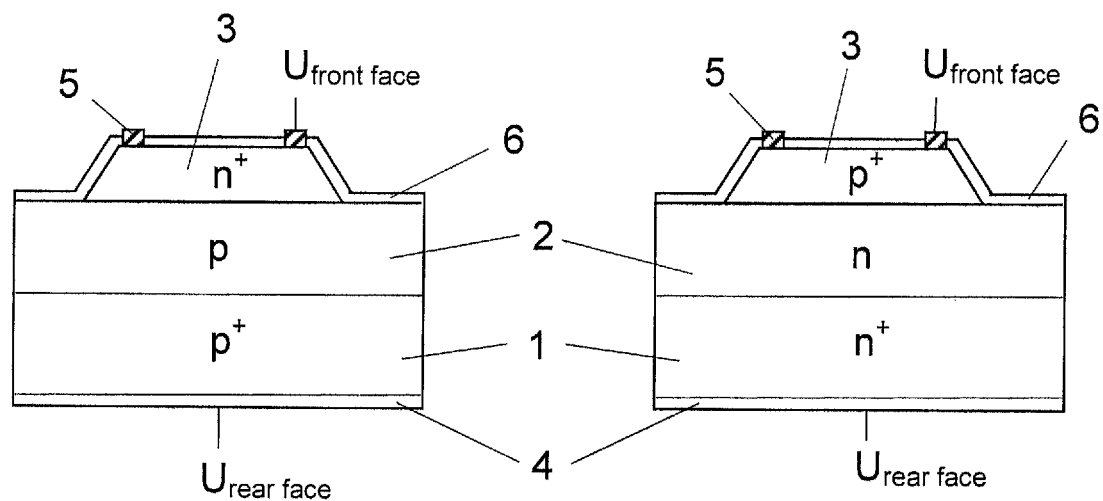
FIG. 1A and FIG. 1B show exemplary configurations of the proposed UV-radiation sensor with a layer sequence of two epitaxial diamond layers of different dopant types.

The proposed UV-radiation sensor is characterised by a radiation sensitive region of monocrystalline diamond with a pn-junction, which is formed by differently doped regions of the diamond. In this respect FIG. 1A shows a first example of the proposed UV-radiation sensor. In this example, the radiation sensor has a p$^+$-doped monocrystalline diamond substrate 1, which can be, for example, an HPHT Ib (100) diamond substrate. On this diamond substrate 1 a first diamond layer 2 is epitaxially deposited, which has a p-doping with a doping concentration of $10^{15}$ cm$^{-3}$ in this example. The layer thickness of the first diamond layer 2 can cover a wide range of, e.g. between 300 nm and 100 μm, and is preferably between 1 and 10 μm. A second diamond layer 3 is epitaxially deposited on this first diamond layer 2, which has a high level of n-doping of $>10^{18}$ cm$^{-3}$ and a thickness of ≤300 nm. The ratio of the doping concentrations between the first and second epitaxial diamond layers is preferably between 1:500 and 1:5000, in particular 1:1000.

The second epitaxial diamond layer 3 is preferably structured laterally, e.g. by dry chemical etching, the result of which is as shown in FIG. 1A. Furthermore, an anti-reflection coating 6 can be applied on the upper face of this layer sequence of first and second diamond layers 2, 3; this also serves as a passivation layer and is designed for wavelengths of ≤220 nm. If so required, the said anti-reflection coating 6 can be applied before the structuring of the second diamond layer 3.

Finally, a contact metallisation 5 of a contact metal is applied locally to the second diamond layer 3 as a first electrical contact. The said contact metallisation 5 can be formed, for example, from platinum, titanium, or a combination of gold and titanium. A metallisation 4 is applied to the rear face of the monocrystalline diamond substrate 1, preferably over the entire surface, as a second electrical contact.

FIG. 1B shows a configuration of the UV-radiation sensor which differs from the configuration of FIG. 1A only in that the dopant types are interchanged. The structuring and manufacture of this UV-radiation sensor take place in the same manner as already described in the context of FIG. 1A. In this example the diamond substrate 1 consists of an n$^+$-doped monocrystalline diamond, e.g. an HPHT IIb (100). A first epitaxial diamond layer 2 is applied on this diamond substrate 1 with a level of n-doping of $1*10^{15}$ cm$^{-3}$ and on this layer is applied in turn a second epitaxially grown diamond layer 3 with a level of p$^+$-doping of $>10^{18}$ cm$^{-3}$ and a thickness of 300 nm. The contact metallisations 4, 5 correspond to those of FIG. 1A.

Figures 2A, 2B:
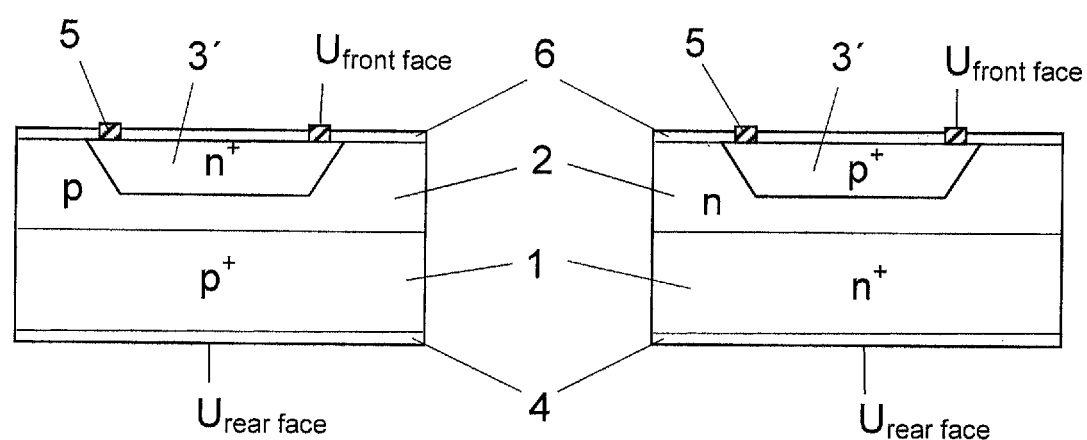
FIG. 2A and FIG. 2B show exemplary configurations of the proposed UV-radiation sensor with an epitaxial diamond layer of a first dopant type into which a locally doped region of a second dopant type is introduced.

Finally, FIG. 2A shows an example of another possible configuration of the proposed UV-radiation sensor in which, in contrast to the configuration of FIG. 1A, only a first diamond layer 2 is epitaxially applied to the p$^+$-doped monocrystalline diamond substrate 1. This p-doped diamond layer 2 with a doping concentration of $10^{15}$ cm$^{-3}$ in this example has a locally doped region 3' of n$^+$-doping with a doping concentration of $>1*10^{18}$ cm$^{-3}$ and a depth or thickness of ≤300 nm. Here too the ratio of the doping concentrations between the first epitaxial diamond layer 2 and the locally doped region 3' is preferably between 1:500 and 1:5000, in particular 1:1000. The further configuration of this UV-radiation sensor with the anti-reflective coating 6 and the contact metallisations 4 and 5 is identical to the configuration of FIG. 1A.

FIG. 2B shows in turn the configuration of such a UV-radiation sensor, in which only the dopant types are interchanged compared with FIG. 2A, in the same manner as in FIG. 1B.

UV-radiation sensors, of the types shown in an exemplary manner in FIGS. 1 and 2, can be manufactured with a high spectral sensitivity ratio of 1:1000 between a wavelength of 200 nm and a wavelength of 240 nm. This makes possible a UV-radiation sensor with a correspondingly high sensitivity and spectral selectivity, which is suitable for interference-free detection of wavelengths ≤220 nm. The proposed UV-radiation sensor can also be combined with a second sensor based on silicon, for example, which is selective for a wavelength range above 220 nm. A difference signal can then be formed from the detection signals of the two sensors in order to increase further the spectral sensitivity. Both sensors can also be implemented on a common substrate.

REFERENCE LIST

1 Diamond substrate
2 First diamond layer
3 Second diamond layer
3' Locally doped region
4 Rear face metallisation
5 Contact metallisation
6 Anti-reflective coating

The invention claimed is:

1. A UV-radiation sensor with a radiation-sensitive region of diamond, which is formed on a first face of a semiconductor substrate and with which electrical contact can be made via at least two contact electrodes,
wherein,
the UV-radiation sensor has a vertical structure, in which
the radiation-sensitive region comprises two differently doped, stacked regions of monocrystalline diamond, which form a pn-junction for purposes of radiation detection, wherein an upper of said two differently doped, stacked regions has a thickness of ≤300 nm, the radiation-sensitive region is formed by a layer sequence of a first epitaxial diamond layer of a first dopant type and a second epitaxial diamond layer of a second dopant type on the semiconductor substrate,
a doping concentration of the first dopant type in the first epitaxial diamond layer is $<1*10^{16}$ cm$^{-3}$ and
a doping concentration of the second dopant type in the second epitaxial diamond layer is $>1*10^{18}$ cm$^{-3}$.

2. A UV-radiation sensor with a radiation-sensitive region of diamond, which is formed on a first face of a semiconductor substrate and with which electrical contact can be made via at least two contact electrodes, wherein, the UV-radiation sensor has a vertical structure, in which the radiation-sensitive region comprises two differently doped, stacked regions of monocrystalline diamond, which form a pn-junction for purposes of radiation detection, wherein an upper of said two differently doped, stacked regions has a thickness of ≤300 nm, the radiation sensitive region is formed by a first epitaxial diamond layer of a first dopant type on the semiconductor substrate, and a locally doped region of a second dopant type in the first epitaxial diamond layer, a doping concentration of the first dopant type in the first epitaxial diamond layer is $<1*10^{16}$ cm$^{-3}$ and a doping concentration of the second dopant type in the second epitaxial diamond layer is $>1*10^{18}$ cm$^{-3}$.

3. The UV-radiation sensor in accordance with claim 1, characterised in that, a ratio of the dopant concentrations of the first dopant type in the first epitaxial diamond layer and the second dopant type in the second epitaxial diamond layer is between 1:500 and 1:5000.

4. The UV-radiation sensor in accordance with claim 1, characterised in that, the semiconductor substrate has a high level of doping of a first dopant type, and on a second face opposite the first face supports a metallisation, which forms a first of the contact electrodes, wherein the high level of doping is selected such that electrical contact with the radiation-sensitive region is made possible by the first contact electrode.

5. The UV-radiation sensor in accordance with claim 4, characterised in that, a local metallisation, which forms a second of the contact electrodes, is applied to the radiation-sensitive region.

6. The UV-radiation sensor in accordance with claim 1, characterised in that, the semiconductor substrate is a monocrystalline diamond substrate.

7. The UV-radiation sensor in accordance with claim 1, characterised in that, an anti-reflection coating is applied onto the radiation-sensitive region.

8. The UV-radiation sensor in accordance with claim 2, characterised in that, a ratio of the dopant concentrations of the first dopant type in the first epitaxial diamond layer and the second dopant type in the locally doped region is between 1:500 and 1:5000.

9. The UV-radiation sensor in accordance with claim 1, wherein said sensor has a ratio of spectral sensitivity, between a wavelength of 200 nm and a wavelength of 240 nm, of the order of 1:1000.

10. The UV-radiation sensor in accordance with claim 2, wherein said sensor has a ratio of spectral sensitivity, between a wavelength of 200 nm and a wavelength of 240 nm, of the order of 1:1000.

* * * * *